(12) United States Patent  
Neumann et al.

(10) Patent No.: US 7,803,255 B2
(45) Date of Patent: Sep. 28, 2010

(54) DEVICE FOR PLASMA-ACTIVATED VAPOR COATING OF LARGE SURFACES

(75) Inventors: Manfred Neumann, Dresden (DE); Steffen Straach, Dresden (DE); Mario Krug, Neustast/Sachsen (DE); Nicolas Schiller, Ot Helmsdorf (DE)

(73) Assignee: Fraunhofer-Gesellschaft zur Förderung der Angewandten Forschung E.V., Munich (DE)

( * ) Notice: Subject to any disclaimer, the term of this patent is extended or adjusted under 35 U.S.C. 154(b) by 1585 days.

(21) Appl. No.: 10/480,791

(22) PCT Filed: Jun. 13, 2002

(86) PCT No.: PCT/EP02/06505

§ 371 (c)(1),
(2), (4) Date: Dec. 18, 2003

(87) PCT Pub. No.: WO02/103077

PCT Pub. Date: Dec. 27, 2002

(65) Prior Publication Data

US 2004/0168635 A1    Sep. 2, 2004

(30) Foreign Application Priority Data

Jun. 19, 2001   (DE) ................................ 101 29 507

(51) Int. Cl.
*C23C 14/34* (2006.01)
*C23C 16/00* (2006.01)
(52) U.S. Cl. ............................ 204/192.38; 204/298.41; 118/723 VE; 118/723 EB; 118/723 MP; 118/723 FE; 118/723 FI

(58) Field of Classification Search ............ 204/192.38, 204/298.26, 298.41; 118/723 VE, 723 EB, 118/723 MP, 723 FE, 723 FI
See application file for complete search history.

(56) References Cited

U.S. PATENT DOCUMENTS 3,898,952 A * 8/1975 Shirahata et al. ............ 118/718

(Continued)

FOREIGN PATENT DOCUMENTS

DE          3206882         10/1982

(Continued)

OTHER PUBLICATIONS

Derwent Abstract of DE 196 12 345 C1.*

(Continued)

*Primary Examiner*—Rodney G McDonald
(74) *Attorney, Agent, or Firm*—Greenblum & Bernstein, P.L.C.

(57) ABSTRACT

The invention relates to a device for the plasma activated vapor coating of large-surface moved substrates, comprising at least one vacuum recipient, one pump system, one evaporator, one device for holding and transporting the substrates to be coated and at least one arc discharge plasma source, whereby at least one device for generating a magnetic field is included, which device can generate a magnetic field between the evaporator and the substrate, the field lines of which magnetic field are aligned approximately perpendicular to the movement direction and parallel to the transport plane of the substrate, and at least one arc discharge plasma source is arranged such that the axis of the arc discharge plasma source is aligned approximately perpendicular to the field lines of the magnetic field.

22 Claims, 2 Drawing Sheets

U.S. PATENT DOCUMENTS

| | | | |
|---|---|---|---|
| 4,378,382 A * | 3/1983 | Behn | 427/9 |
| 5,436,035 A | 7/1995 | Lohwasser | 427/525 |
| 5,580,386 A | 12/1996 | Lohwasser | 118/723 MP |
| 5,635,087 A * | 6/1997 | Schiller et al. | 219/121.43 |
| 5,846,608 A * | 12/1998 | Neumann et al. | 427/529 |
| 6,379,757 B1 | 4/2002 | Iacovangelo | 427/576 |

FOREIGN PATENT DOCUMENTS

| | | |
|---|---|---|
| DE | 4412906 | 7/1995 |
| DE | 19612345 C1 * | 3/1996 |
| DE | 19523529 | 1/1997 |
| DE | 19612345 | 1/1997 |
| DE | 19612344 | 8/1997 |
| DE | 19546827 | 3/1999 |
| DE | 1001839 | 5/2001 |
| EP | 666933 | 6/1996 |
| EP | 545863 | 3/1997 |
| EP | 0887433 | 12/1998 |

OTHER PUBLICATIONS

Translation of DE 196 12 345 C1.*

* cited by examiner

DEVICE FOR PLASMA-ACTIVATED VAPOR COATING OF LARGE SURFACES

CROSS-REFERENCE TO RELATED APPLICATIONS

The present application is a U.S. National Stage of PCT/EP02/06505 filed Jun. 13, 2002, and claims priority to German Application No. 101 29 507.3 filed Jun. 19, 2001.

BACKGROUND OF THE INVENTION

1. Field of the Invention

The invention relates to a device for the plasma-activated vapor coating of large surfaces with high coating rates. The large-surface substrates to be coated can be sheets of plastic, glass or metal, or also strip materials such as plastic films, pre-coated papers or textiles and small-area bodies arranged on large transport frames. Typical uses are the application of reflecting, reflex-reducing or decorative layers and the production of abrasion protection layers, corrosion protection layers or barrier layers. In most cases very adhesive layers of great thickness are necessary, which layers can only be deposited with the aid of plasma-activated processes. With high vapor deposition rates, correspondingly high plasma densities are necessary in order to obtain the desired effects of the plasma activation.

2. Discussion of Background Information

It is known and for various technological reasons often necessary to use arc discharge plasma sources to produce high plasma densities (see, e.g. EP 0 545 863 B1; EP 0 666 933 B1). Due to the spatial limitation of such arc discharges, to coat large surfaces the substrates have to be moved over the coating device, and several arc discharge plasma sources have to be arranged next to one another perpendicular to the movement direction of the substrates.

It is further known to use a magnetic field aligned in the movement direction of the substrates and parallel to the axis of the plasma sources to increase the plasma expansion in the movement direction of the substrates (EP 0545 863 B1: EP 0 666 933 B1; DE 196 12 344 C1; DE 196 12 345 C1). Moreover this magnetic field is used to increase the plasma density near the substrate surface and, in the case of electron beam vapor deposition, to decouple the arc discharge plasma from the high-energy electron beam necessary for the evaporation.

The arrangement of several arc discharge plasma sources next to one another perpendicular to the movement direction of the large-surface substrates inevitably leads to a certain nonuniformity of the plasma density perpendicular to the movement direction of the substrates. It was therefore suggested to cause a horizontal alternating deflection of the arc plasma by alternating magnetic fields, thus improving the uniformity of the plasma perpendicular to the movement direction of the substrates. Although in this manner on average a substantial increase of the uniformity of the plasma can be achieved, at high coating rates and high transport speeds very high alternating deflection frequencies must be used in order to avoid undesirable fluctuations of the layer properties in the movement direction of the substrates or in the direction of the surface normals. This requires relatively expensive solutions for the alternating deflection systems, and special time deflection programs are necessary for an optimum uniformity.

SUMMARY OF THE INVENTION

One aspect of the invention is to create a device for the plasma-activated vapor coating of large surfaces with which device a plasma with high plasma density and a high uniformity of the plasma is produced perpendicular to the movement direction of the substrates in a simple and cost-effective manner.

The above-noted aspect is attained according to the invention with a device for the plasma-activated vapor coating of large-surface moved substrates. The device contains at least one vacuum recipient, a pump system, an evaporator, a device for holding and transporting the substrates to be coated and at least one arc discharge plasma source. At least one device generating magnetic fields is included, which can generate a magnetic field in the vapor deposition zone between the evaporator and the substrate. The field lines of the magnetic field are aligned approximately perpendicular to the movement direction and parallel to the transport plane of the substrate, and at least one arc discharge plasma source is arranged such that the axis of the arc discharge plasma source is aligned approximately perpendicular to the field lines of the magnetic field.

In accordance with further features of the invention, at least one arc discharge plasma source can be arranged such that the axis of the arc discharge plasma source is aligned approximately parallel to the transport plane of the substrates. Further, strips can be moved in a linear manner, and plates or molded bodies arranged on transport frames may be provided as substrates. The evaporator can extend across the entire substrate width perpendicular to the movement direction and parallel to the transport plane of the substrates and a single long large-surface evaporator or a row of small-surface evaporators may be arranged next to one another. Moreover, electron beam evaporators can be provided as evaporators, whereby one or more axial electron guns may be arranged in a parallel manner next to one another and their axes can be approximately parallel to the movement direction of the substrates. The programmed deflection of the electron beams perpendicular to the transport direction of the substrates is provided. Still further, hollow cathode arc discharge sources can be provided as arc discharge plasma sources. Several hollow cathode arc discharge sources can be arranged next to one another in a parallel manner and with their axes approximately parallel to the movement direction of the substrates. Anodes of the hollow cathode arc discharge sources can be arranged on the side of the vapor deposition zone opposite the hollow cathodes. Further still, the anodes of the hollow cathodes arc discharge sources can be embodied in a ring-shape and are arranged directly in front of the plasma discharge openings of the hollow cathodes. For each hollow cathode arc discharge source, a second anode can be provided having a positive potential with respect to the associated ring-shaped anode and being arranged near the evaporator surface. Magnetic compensation coils can be included whose magnetic field ensures that the magnetic field aligned approximately perpendicular to the movement direction of the substrates is reduced in the area of the plasma discharge openings of the hollow cathodes. Moreover, magnet coils coaxial to the hollow cathodes can be included whose magnetic field ensures that a magnetic field approximately parallel to the hollow cathode axes is present in the area of the plasma discharge openings of the hollow cathodes. Also the magnetic field can be aligned approximately perpendicular to the movement direction and parallel to the transport plane of the substrates and can be dimensioned with respect to magnetic field strength and geometry such that in the case of the electron beam evaporation the electron beams produced in the electron guns and deflected across the entire evaporator width strike the evaporator surface at an angle between zero and 60° to the surface normal. Moreover, two magnet pole shoes can be provided to generate the magnetic field aligned approximately perpendicular to the movement direction and parallel to the transport plane of the substrates. The magnet pole shoes can be arranged at the side of the vapor deposition zone seen in the movement direction of the substrates. A magnet coil can be provided to generate the magnetic field aligned approximately perpendicular to the movement direction of the substrates. The length of the magnet coil can be greater than the width of the moved substrates and whose axis is aligned perpendicular to the movement direction and parallel to the transport plane of the substrates. The magnet coil can have a ferromagnetic coil core along its axis. Furthermore, the number of windings per coil length can be different along the coil axis. The number of windings per coil length can be greater at the coil ends than in the coil center. The magnet coil can comprise several partial coils arranged in a row in the axial direction. The currents in the individual partial coils can be adjusted differently. The currents through the outer partial coils can be adjusted to be greater than the currents through the inner partial coils.

In a known vacuum recipient that can be evacuated via a pump system there is at least one evaporator, at least one device for holding and transporting the substrates to be coated and at least one plasma source. Arc discharge plasma sources are used as plasma sources. These produce a high proportion of focused low-voltage electrons that without the interference of outer magnetic fields run approximately parallel to the axis of the arc discharge plasma source.

According to the invention, devices that generate magnetic fields are arranged such that a magnetic field forms whose field lines run approximately perpendicular to the movement direction and approximately parallel to the transport plane of the substrates. The arc discharge plasma sources are arranged so that their axes are aligned approximately perpendicular to the field lines of the magnetic field. The axes of the arc discharge plasma sources are preferably aligned parallel to the transport plane of the substrates. Through the magnetic field with a field direction perpendicular to the axis of the arc discharge plasma sources, the focused low-voltage electrons of the arc discharge likewise extend perpendicular to the axis of the arc discharge plasma sources. This is due to the fact that the low-voltage electrons with a typical energy of 10 eV are deflected in a magnetic field with a typical field strength of 1 kA/m with a radius of approx. 1 cm, and with this radius as they are wrapped around the magnetic field lines running perpendicular to the plasma source and form a plasma tube. With the solutions hitherto known with the magnetic field lines running in the direction of the plasma sources axis, this effect was used to concentrate the plasma in along the plasma sources direction and thus to achieve a high plasma density and a large range of the plasma stream. According to the present invention, the magnetic field lines run approximately perpendicular to the plasma sources axis so that the plasma tube likewise extends perpendicular to the axis of the plasma sources. A high uniformity of the plasma across the entire width of the substrate is thus achieved by arranging several plasma sources next to one another, even without the laborious alternating deflection.

A corresponding uniformity of the vapor stream for coating the moved substrates is obtained in a manner known per se in that a large-surface evaporator or a row of small surface evaporators arranged next to one another extends across the entire width of the substrate. In the case of electron beam evaporation, the control of the vapor density distribution can occur across the width of the substrate through the programmed deflection of one or more electron beams that are produced in one or in several axial electron guns arranged next to one another in a parallel manner.

It has proven to be advantageous to use hollow cathode arc discharge sources for producing the plasma. The plasma sources are arranged parallel next to one another with a lateral spacing of preferably 100 to 300 mm, whereby the axes of the plasma sources are aligned in the movement direction of the substrates.

It is particularly advantageous if an anode is assigned to each hollow cathode arc discharge source, which anode is arranged either on the side of the vapor deposition zone opposite the hollow cathode or as a ring anode directly in front of the respective hollow cathode. The arrangement on the opposite side of the vapor deposition zone has the advantage that despite the alignment of the magnetic field lines perpendicular to the movement direction of the substrate, the plasma electrons are drawn through the vapor deposition zone onto the opposite anodes so that an ionization of the entire vapor deposition zone occurs. For certain uses, e.g., for the production of gradient layers, it can be advantageous if the plasma activation takes place only on the entry side of the substrates into the vapor deposition zone, and on the delivery side no plasma activation or only a low plasma activation occurs. In this case the arrangement of ring-shaped anodes directly in front of the hollow cathodes is recommended, whereby a plasma tube forms in the area of the discharge openings of the hollow cathodes perpendicular to the transport direction of the substrates and perpendicular to the axes of the hollow cathodes.

It can also be advantageous to arrange ring-shaped anodes directly in front of the hollow cathodes and to additionally assign a second anode to each ring-shaped anode, which second anode features a positive potential relative to the respective ring-shaped anode. These second anodes can be arranged on the side of the vapor deposition zone opposite the hollow cathodes as well as in the area of the evaporator surface. With the arrangement on the side opposite the hollow cathodes, as during operation without ring anode, a uniform ionization is achieved across the entire vapor deposition zone. With the arrangement of the second anode in the area of the evaporator surface, in a manner already known per se a potential drop in the vapor extension direction is produced which leads to an additional acceleration of ions onto the substrate and thus to improved layer properties. The second anodes can also be used in a known manner (DE 100 18 639 C 1) to admit reactive gases for the plasma activated reactive vapor deposition.

One possibility for displacing the plasma tube, i.e., a displacement of the zone of the maximum plasma activation, from the opening of the hollow cathodes in the direction of the center of the vapor deposition zone, is to weaken the magnetic field in the area of the hollow cathode openings by means of magnetic compensation coils such that the low-voltage electrons issuing from the hollow cathode openings first expand in the direction of the hollow cathode axes before they are forced by the magnetic field growing stronger onto screw paths along the magnetic field lines running crosswise.

Another possibility for displacing the plasma tube from the opening of the hollow cathodes in the direction of the center of the vapor deposition zone is to surround each hollow cathode with a coaxial magnet coil, thus generating a magnetic field parallel to the hollow cathode axis, which magnetic field bundles the low-voltage electrons issuing from the hollow cathode in the direction of the hollow cathode axis, so that the formation of the plasma tube perpendicular to the hollow cathode axes does not occur until a greater distance from the hollow cathode openings, i.e. outside the area of the magnetic field parallel to the hollow cathode axis.

In the case of electron beam evaporation, apart from forming a uniform plasma, the magnetic field aligned perpendicular to the movement direction of the substrates can also be used in a manner known per se to deflect the electron beam necessary for the evaporation onto the surface of the evaporation material. It is thereby expedient to dimension the geometry and the field intensity of the magnetic field such that the electron beam deflected across the evaporator width strikes the evaporator surface in each deflection phase at an angle between zero and 60° to the surface normal.

The generation of the magnetic field arranged perpendicular to the movement direction of the substrates can occur through two magnet pole shoes that are arranged at the side of the vapor deposition zone seen in the movement direction of the substrates.

The magnetic field can also be generated through a long magnet coil, whose length is greater than the width of the moved substrates, and whose axis is aligned perpendicular to the movement direction of the substrates and parallel to the transport plane of the substrates. It is advantageous if the long magnet coil is provided with a ferromagnetic coil core. To influence the plasma density distribution perpendicular to the movement direction of the substrates and/or to achieve largely identical impact angles of the electron beam on the evaporator surface, in the case of the electron beam evaporation it is expedient to adjust the distribution of direction and strength of the magnetic field across the width of the coating accordingly. This can take place through the variation of the number of windings per coil length along the coil axis. It can also take place in that the magnet coil comprises several partial coils lined up in the axial direction, whereby the currents in the individual partial coils are adjusted differently. It has proven to be expedient to select the number of windings per coil length or the currents through the partial coils to be greater at the coil ends than in the coil center.

The invention will be explained in greater detail using an exemplary embodiment. The associated drawings show the side view and the plan view of a device according to the invention.

DETAILED DESCRIPTION OF THE PRESENT INVENTION

Figure 1:
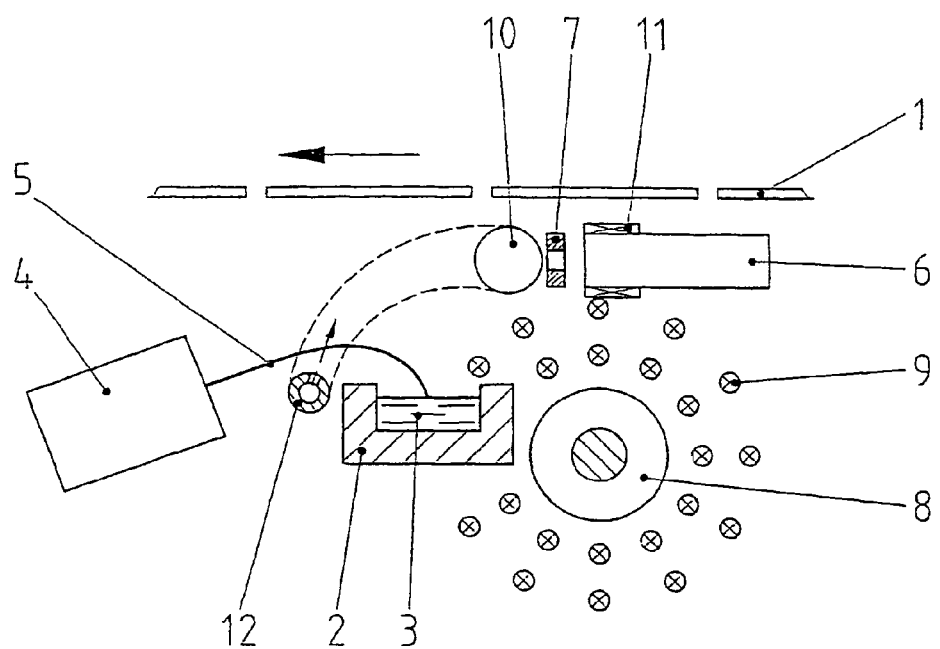
FIG. 1 shows a side view of the large-surface substrates to be coated.

FIG. 1 shows in side view the large-surface substrates 1 to be coated, e.g., 2 m wide plastic plates that are guided by a transport system (not shown) at a constant speed from right to left over the coating device. The evaporation material 3, e.g., aluminum, located in an evaporator crucible 2, is heated by the electron beam 5 produced in an axial electron gun 4 and made to evaporate. A hollow cathode arc discharge source, whose axis is aligned approximately parallel to the movement direction of the substrates 1, is used as plasma source 6. The hollow cathode arc discharge burns between the hollow cathode inside the plasma source 6 and the ring-shaped anode 7 arranged directly in front of the hollow cathode opening. The low-voltage electrons passing through the opening of the ring-shaped anode are forced onto circular paths by the magnetic field 9 generated by a magnet coil 8, aligned perpendicular to the axis of the plasma source 6 and perpendicular to the movement direction of the substrates 1, and form a plasma tube 10 perpendicular to the movement direction of the substrates 1 directly behind the ring-shaped anode 7. This plasma tube 10 can be produced at a greater distance from the ring-shaped anode 7, e.g., centrally over the evaporator crucible 2, if a magnetic field parallel to the hollow cathode axis is generated near the hollow cathode opening by magnet coils 11 axial to the hollow cathode, which magnetic field first of all axially bundles the low-voltage electrons before they are forced onto circular paths at a greater distance from the hollow cathode opening through the magnetic field 9 perpendicular to the hollow cathode axis. Through a second anode 12 that is at a potential approximately +30 V higher than the ring-shaped anode 7, a secondary discharge can be ignited between the plasma tube 10 and the second anode 12. With discharge currents of the secondary discharge of approx. 100 A a strong ionization of the evaporated material occurs. The ions formed thereby are accelerated in the direction of the substrate 1 through the vertical potential drop between ring-shaped anode 7 and second anode 12, and lead to an increased density of the condensing layer. For the reactive coating of the substrates 1, e.g., for the precipitation of aluminum oxide during evaporation of metallic aluminum, a reactive gas, e.g., oxygen, can be admitted into the vapor deposition zone through nozzles in the second anode 12. Through the secondary discharge between ring-shaped anode 7 and second anode 12 this reactive gas is excited and ionized so that its reactivity is substantially increased.

Figure 2:
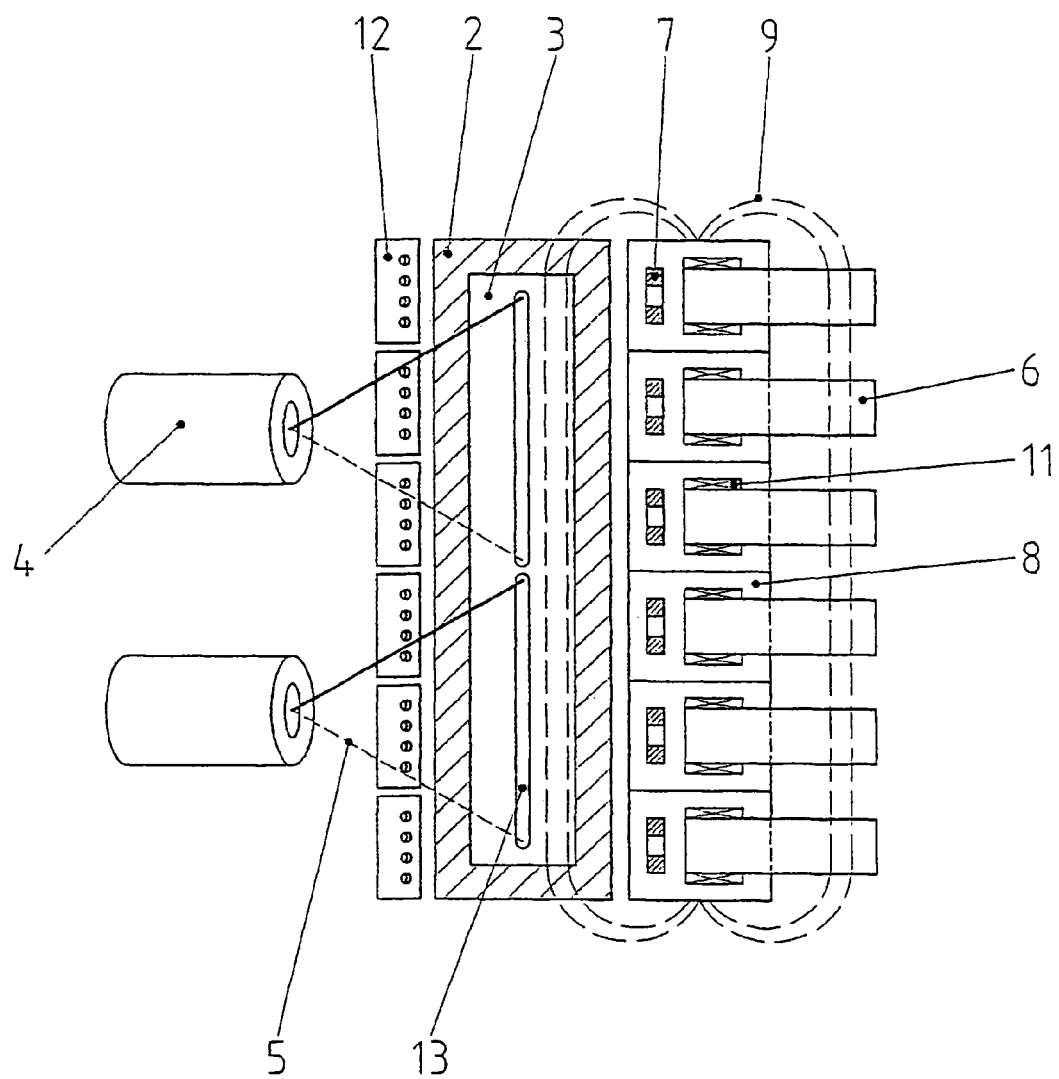
FIG. 2 shows the same arrangement as FIG. 1 in a plan view.

FIG. 2 shows the same arrangement in the plan view. For the coating of the substrates 1 approx. 2 m wide (not shown here), an evaporator crucible 2 approx. 2.5 m wide is required on which two deflection lines 13 joining one another, each approx. 1.1 m long, are generated through programmed lateral deflection of the electron beams 5 produced in two axial electron guns 4. The dwell time of the electron beams 5 on the individual points of the deflection lines 13 is programmed or regulated such that the thickness of the layer evaporated onto the substrates 1 is approximately constant across the entire coating width. In addition to guiding the low-voltage electrons of the plasma, the magnetic field 9 generated by the magnet coil 8 and approximately perpendicular to the axis of the electron guns 4 and the plasma sources 6, also serves to deflect the electron beams 5 onto the surface of the evaporation material 3 (cf. FIG. 1). The geometry and the strength of this magnetic field 9 are adjusted such that the electron beams 5 strike the evaporation material 3 for each point of the deflection lines 13 at as small an angle as possible to the surface normal. For this reason in the present example the magnet coil 8 is divided into 6 partial coils that can be acted on with different coil currents. In this manner it is possible to adjust the magnetic field strength and thus the deflection angle of the electron beams 5 for each point of the deflection lines 13 in the desired manner.

The invention claimed is:

1. A device for plasma-activated vapor coating of large-surface substrates, comprising:
   at least one vacuum recipient;
   a pump system;
   an evaporator;
   a device for holding and transporting the substrates to be coated;
   at least one arc discharge plasma source;
   at least one magnetic field generator structured and arranged to generate a magnetic field in a vapor deposition zone located between said evaporator and the substrate holding and transporting device, wherein field lines of the magnetic field are aligned approximately perpendicular to a movement direction and parallel to a transport plane of the substrates be coated; and the at least one arc discharge plasma source having an axis aligned approximately perpendicular to the field lines of the magnetic field.

2. The device according to claim 1, wherein the axis of the at least one arc discharge plasma source is aligned approximately parallel to the transport plane of the substrates.

3. The device according to claim 1, wherein the substrates comprise: one of linearly movable strips, plates and small-area bodies arranged on transport frames.

4. The device according to claim 1, wherein the evaporator is structured to extend across an entire substrate width perpendicular to the movement direction and parallel to the transport plane of the substrates.

5. The device according to claim 1, wherein the evaporators comprise: electron beam evaporators, composed of one or more axial electron guns are arranged in a parallel manner next to one another having axes approximately parallel to the movement direction of the substrates, and a programmed deflector that deflects the electron beams perpendicular to the transport direction of the substrates.

6. The device according to claim 1, wherein the at least one arc discharge plasma source comprises at least one hollow cathode arc discharge source.

7. The device according to claim 6, wherein the at least one hollow cathode arc discharge source comprises: a plurality of hollow cathode arc discharge sources arranged next to one another in a parallel manner having axes approximately parallel to the movement direction of the substrates.

8. The device according to claim 6, further comprising anodes associated with the at least one hollow cathode arc discharge source that are arranged on a side of the vapor deposition zone opposite the hollow cathodes.

9. The device according to claim 6, wherein anodes of the hollow cathode arc discharge source are ring-shaped and arranged directly in front of plasma discharge openings of the hollow cathodes.

10. The device according to claim 9, further comprising:
a second anode for each hollow cathode arc discharge source having a positive potential with respect to an associated ring-shaped anode and that is arranged near a surface of the evaporator.

11. The device according to claim 6, further comprising: magnetic compensation coils having a magnetic field aligned approximately perpendicular to the movement direction of the substrates that is reduced in an area of plasma discharge openings of the at least one hollow cathode arc discharge source.

12. The device according to claim 6, further comprising: magnet coils coaxial to the at least one hollow cathode arc discharge source having a magnetic field approximately parallel to hollow cathode axes in an area of plasma discharge openings of the at least one hollow cathode arc discharge source.

13. The device according to claim 1, wherein the device is structured and arranged so that the magnetic field aligned approximately perpendicular to the movement direction and parallel to the transport plane of the substrates is dimensioned, with respect to magnetic field strength and geometry, such that the electron beams are deflected across an entire evaporator width and strike the evaporator surface at an angle between zero and 60° to the surface normal.

14. The device according to claim 13, further comprising:
two magnet pole shoes that generate a magnetic field aligned approximately perpendicular to the movement direction and parallel to the transport plane of the substrates,
wherein the magnet pole shoes are arranged at a side of the vapor deposition zone seen in the movement direction of the substrates.

15. The device according to claim 1, further comprising:
a magnet coil structured to generate a magnetic field aligned approximately perpendicular to the movement direction of the substrates, wherein a length of the magnet coil is greater than the width of the substrates and an axis of the magnet coil is aligned perpendicular to the movement direction and parallel to the transport plane of the substrates.

16. The device according to claim 15, wherein the magnet coil has a ferromagnetic coil core along its axis.

17. The device according to claim 15, wherein a number of windings per coil length varies along the magnet coil axis.

18. The device according to claim 17, wherein the number of windings per coil length is greater at the magnet coil ends than in the magnet coil center.

19. The device according to claim 15, wherein the magnet coil comprises several partial coils arranged in a row in the axial direction, whereby currents in individual partial coils are independently adjustable.

20. The device according to claim 19, wherein currents through outer partial coils are adjusted to be greater than currents through inner partial coils.

21. The device according to claim 4, wherein the evaporator is structured and arranged as one of a single long large-surface evaporator and a row of small-surface evaporators arranged next to one another.

22. A plasma-activated vapor coating device comprising:
at least one device that generates a magnetic field in a vapor deposition zone between an evaporator and a movable substrate, in which field lines of the magnetic field are aligned approximately perpendicular to a movement direction of the substrate and parallel to a transport plane of the substrate; and
at least one arc discharge plasma source having an axis oriented approximately perpendicularly to the field lines of the magnetic field.

* * * * *